United States Patent
Yamano

(10) Patent No.: US 7,468,292 B2
(45) Date of Patent: Dec. 23, 2008

(54) METHOD OF MAKING WAFER LEVEL PACKAGE STRUCTURE BY GRINDING THE BACKSIDE THEREOF AND THEN FORMING METAL LAYER ON THE GROUND SIDE

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 271 days.

(21) Appl. No.: 11/546,285

(22) Filed: Oct. 12, 2006

(65) Prior Publication Data

US 2007/0032066 A1 Feb. 8, 2007

Related U.S. Application Data

(62) Division of application No. 10/988,508, filed on Nov. 16, 2004, now Pat. No. 7,417,311.

(30) Foreign Application Priority Data

Nov. 25, 2003 (JP) .............................. 2003-393695

(51) Int. Cl.
H01L 21/00 (2006.01)
(52) U.S. Cl. ...................................... 438/113; 438/127
(58) Field of Classification Search ................. 438/110, 438/113, 127
See application file for complete search history.

(56) References Cited

U.S. PATENT DOCUMENTS 6,329,288 B1 12/2001 Tokushige et al. .......... 438/675
6,479,900 B1 11/2002 Shinogi et al. .............. 257/758
2004/0266139 A1* 12/2004 Shibata ....................... 438/465

FOREIGN PATENT DOCUMENTS

| JP | 10-177974 | 6/1998 |
|---|---|---|
| JP | 2000-188357 | 7/2000 |
| JP | 2000-228412 | 8/2000 |
| JP | 2001-135742 | 5/2001 |
| JP | 2001-168231 | 6/2001 |
| JP | 2002-231854 | 8/2002 |
| JP | 2002-270720 | 9/2002 |

OTHER PUBLICATIONS

Chinese Office Action mailed May 11, 2007.
Japanese Office Action mailed Nov. 14, 2006, 2 pages (1 page partial English translation).

* cited by examiner

*Primary Examiner*—Bradley K Smith
(74) *Attorney, Agent, or Firm*—Kratz, Quintos & Hanson, LLP

(57) ABSTRACT

A semiconductor wafer is thinned to a predetermined thickness by grinding the backside thereof (which is opposite to the side where a plurality of devices are formed and metal posts are further formed), and then a metal layer made of metal having a linear thermal expansion coefficient close to that of the semiconductor wafer is formed on the ground side. Further, the semiconductor wafer is sealed with resin, metal bumps are bonded to the tops of the metal posts (barrier metal layer), and then the semiconductor wafer is divided into the respective semiconductor devices. Silicon is used as material for the semiconductor wafer, and tungsten or molybdenum is used as metal constituting the metal layer.

4 Claims, 6 Drawing Sheets

FIG. 6

| METAL SEED | ELASTIC MODULUS (E) (UNIT:Pa) | LINEAR THERMAL EXPANSION COEFFICIENT ($\alpha$) (UNIT:$K^{-1}$) | THERMAL CONDUCTIVITY (AT 0°C) (UNIT:W/m·k) |
|---|---|---|---|
| W | $4.03 \times 10^{11}$ | 4.5 | 177 |
| Mo | $3.34 \times 10^{11}$ | 3.7~5.3 | 139 |
| Al | $7.03 \times 10^{10}$ | 23.1 | 236 |
| Au | $7.80 \times 10^{10}$ | 14.2 | 319 |
| Ti | $11.57 \times 10^{10}$ | 8.6 | 41 |
| Cu | $12.98 \times 10^{10}$ | 16.5 | 403 |

(Si: $\alpha \approx 2.6 \, [K^{-1}]$)

METHOD OF MAKING WAFER LEVEL PACKAGE STRUCTURE BY GRINDING THE BACKSIDE THEREOF AND THEN FORMING METAL LAYER ON THE GROUND SIDE

CROSS REFERENCE TO RELATED APPLICATION

This application is a divisional application of U.S. application Ser. No. 10/988,508 filed Nov. 16, 2004, now U.S. Pat No. 7,417,311 and claims the right of priority under 35 U.S.C. §119 based on Japanese Patent Application No. 2003-393695 filed on Nov. 25, 2003, which is hereby incorporated by reference herein in its entirety as is fully set forth herein.

BACKGROUND OF THE INVENTION (a) Field of the Invention

The present invention relates to a semiconductor device and a method of fabricating the same. More specifically, the present invention relates to a semiconductor device and a method of fabricating the same, involving a back grinding process for thinning a wafer in a wafer-level package in which a plurality of devices are formed.

It is noted that, in the description below, unless otherwise defined, a "semiconductor device" means an individual semiconductor element (device) which is formed in a wafer and which is still in an undivided state, as well as an individual semiconductor chip (device) after being divided from a wafer.

(b) Description of the Related Art

In recent years, with the demand for the miniaturization of electronic instruments and devices, attempts have been made to miniaturize and densify semiconductor devices used in the electronic instruments and devices. Accordingly, semiconductor devices each having a chip-scale package (CSP) structure in which miniaturization has been achieved by bringing the shape of a semiconductor device as close as possible to the shape of a semiconductor element (semiconductor chip), have been developed and fabricated.

In a typical semiconductor device having a CSP structure, a passivation film (insulating film) as a protective film is formed on the surface of a semiconductor wafer on the side where devices are formed, and a rerouting layer (rerouting pattern) for linking a wiring layer (electrode pads) of each device to the outside of a package through via holes formed in predetermined positions in the insulating film is formed on the insulating film. Further, metal posts are provided in terminal formation portions of the rerouting layer, and the entire surface on the side where the metal posts are formed is sealed with sealing resin (however, such that the tops of the metal posts are exposed). Furthermore, metal bumps as external connection terminals are bonded to the tops of the metal posts.

For various kinds of devices including flash memories, DRAMs, and the like, which are considered to be applications of semiconductor devices each having the above-described CSP structure, the future trend is that the demand for the thinning of wafer-level packages in a phase before they are divided into individual semiconductor chips is increasingly growing. In this connection, a process for grinding the backside of a wafer is generally performed to attempt the above-described thinning.

In a conventional fabrication process of a wafer-level package, a process for grinding the backside of a wafer has been performed in the initial phase. Namely, in a phase (phase before a passivation film (insulating film) is formed on a wafer surface) after a plurality of devices have been formed in a semiconductor wafer, the wafer has been thinned by a back grinding (BG) process using a wafer back grinding machine, which is a typical method, and then the wafer has been brought to the subsequent steps.

Technologies relating to the BG process for thinning a wafer as described above include, for example, one in which a wafer backside is ground after resin sealing, as described in Japanese unexamined Patent Publication (JPP) 2002-270720, or in JPP 2002-231854.

As described above, in a conventional fabrication process of a wafer-level package, a wafer back grinding process has been performed in the initial phase, and the wafer has needed to be brought to all the subsequent steps in a thinned state (thin-wafer state). Accordingly, there has been a high possibility in that a fatal defect called "wafer cracking" occurs during the fabrication process.

Further, there has also been a problem in that the entire wafer warps during the fabrication process where the wafer is thinned. For example, when sealing with mold resin and thermosetting (cure) thereof are performed, a very thin wafer is pulled toward the resin layer side under the influence of the thermal shrinkage of the mold resin, and thus the entire wafer warps. Accordingly, the wafer must be brought to the steps (solder ball placement, reflow, dicing, and the like) after the step of resin sealing in a warped state. Thus, in conventional technologies, there has been a disadvantage in that the entire wafer warps in thinning a wafer-level package.

One conceivable method for coping with such a disadvantage is, for example, to form a film layer (e.g., an interlayer insulating film for buildup, which is made of epoxy resin, silicone resin, polyimide resin, or the like) for warp correction on the wafer backside by vacuum lamination. In this case, an epoxy-based, silicone-based, polyimide-based film layer cannot be substantially stripped off after the film layer has been formed (after a cure process has been performed), and therefore needs to be left as a permanent film. Accordingly, various kinds of reliability tests including a test on the reliability of adhesiveness to the wafer need to be performed on the wafer having the permanent film (film layer for warp correction) attached thereto.

However, in this case, there is the following problem: when the wafer is finally diced and divided into individual semiconductor chips (devices), chipping, cracking, or the like, occur to each chip due to a mechanical shock during dicing, and the chipping or the like causes delamination between the permanent film (film layer) and the device interface (chip backside). Namely, since delamination occurs between the film layer and the chip backside after various kinds of reliability tests have been performed, the reliability tests performed once are wasted.

Moreover, in the above-described method in which a film-like epoxy resin material is formed for wafer warp correction, there is a disadvantage in that the number of steps is relatively large. Namely, such a film-like epoxy resin material typically has a two-layer structure in which a base material (PET film) made of polyester resin is coated with epoxy resin. In order to form such a film-like epoxy resin material on the wafer backside, the following four steps are needed: a step of laminating a film-like epoxy resin material on the wafer backside, a step of removing an unnecessary peripheral portion of the epoxy resin material, a step of stripping off a base material (PET film) protecting the epoxy resin, and a step of thermally curing the epoxy resin.

Furthermore, the film layer (insulating resin layer of epoxy resin or the like) formed on the wafer backside is left as a permanent film as it is even after dicing (after the wafer has been divided into chips). Accordingly, the backside of each chip (package) is covered with the insulating resin layer. This affects heat spread properties of the entire package.

SUMMARY OF THE INVENTION

An object of the present invention is to provide a semiconductor device and a method of fabricating the same, in which in realizing the thinning of a wafer-level package, wafer cracking is prevented, wafer warp is corrected, and various kinds of reliability tests performed once are prevented from being wasted, and which can contribute to a simplification of a fabrication process and an improvement in heat spread properties.

To attain the above object, according to one aspect of the present invention, there is provided a method of fabricating a semiconductor device, including the steps of: forming an insulating film on a surface of a semiconductor wafer on a side where a plurality of devices are formed, the insulating film having an opening portion to which an electrode pad of each device is exposed; forming a conductor layer on the insulating film, the conductor layer being patterned into a required shape to cover the opening portion to which the electrode pad is exposed; forming a resist layer on the conductor layer, the resist layer having an opening portion to which a terminal formation portion of the conductor layer is exposed; forming a metal post in the terminal formation portion of the conductor layer with the resist layer being used as a mask; thinning the semiconductor wafer to a predetermined thickness by grinding one surface thereof, the one surface being opposite to a side where the metal post is formed; forming a metal layer on the ground surface of the semiconductor wafer after removing the resist layer, the metal layer being made of metal having a linear thermal expansion coefficient close to that of the semiconductor wafer; sealing the surface of the wafer with sealing resin with a top of the metal post being exposed; bonding a metal bump to the top of the metal post; and dividing the semiconductor wafer to which the metal bump is bonded, into each device.

According to the method of fabricating a semiconductor device of this aspect, a semiconductor wafer can be processed in a relatively thick state (thick-wafer state) until the step of forming the metal post. Moreover, even after the semiconductor wafer is thinned by grinding the surface (wafer backside) opposite to the side where the metal post is formed, the existence of the metal layer formed on the wafer backside immediately thereafter allows the semiconductor wafer to be brought to steps in the thick-wafer state. Namely, since the metal layer plays a role in reinforcing the semiconductor wafer and allows the semiconductor wafer to be brought to almost all steps in the thick-wafer state, the occurrence of wafer cracking can be prevented in realizing the thinning of a wafer-level package.

Moreover, the metal layer formed on the backside of the semiconductor wafer is made of metal having a linear thermal expansion coefficient close to that of the semiconductor wafer, and therefore also plays a role in correcting a warp of the semiconductor wafer when resin sealing accompanied by heat treatment is performed in a later phase. Namely, the metal layer has a function of maintaining the flatness of the semiconductor wafer after the step of resin sealing.

This metal layer is finally left as a permanent film as in conventional technologies. However, since the difference in linear thermal expansion coefficient between the metal layer and the semiconductor wafer is relatively small, chipping, cracking, or the like, does not easily occur under a mechanical shock during dicing when the wafer is finally diced and divided into chips (devices). As a result, delamination almost never occurs between the permanent film (metal layer) and the device interface (chip backside). Accordingly, there is no disadvantage in that various kinds of reliability tests (test on the reliability of adhesiveness to the wafer, and the like) performed before dicing are wasted due to the occurrence of delamination as heretofore.

Moreover, since the metal layer is formed in one step, the fabrication process can be simplified compared with the case where an insulating resin layer of epoxy resin or the like is formed through a relatively large number of steps (four steps of laminating an epoxy resin material, removing an unnecessary peripheral portion, stripping off a protective base material, and cure) as heretofore.

Furthermore, each device (package) has a structure in which the metal layer is exposed to the backside thereof. Accordingly, heat spread effect can be expected compared with a structure in which the backside of a package is covered with an insulating resin layer of epoxy resin or the like as heretofore. Namely, the metal layer can function as a heat spreader.

Also, according to another aspect of the present invention, there is provided a semiconductor device having a chip-scale package structure in which one side of a semiconductor wafer is sealed with sealing resin with a metal bump being exposed, the metal bump being formed on the one side, the semiconductor device including a metal layer made of metal having a linear thermal expansion coefficient close to that of the semiconductor wafer, the metal layer being formed on other side of the semiconductor wafer.

According to the constitution of the semiconductor device of this aspect, the semiconductor wafer has a structure in which the metal layer is exposed to the other side (wafer backside) thereof, and therefore has an advantage in heat spread effect.

BRIEF DESCRIPTION OF THE DRAWINGS

FIG. 6 is a table showing physical properties of various metals which constitute the metal layer in the semiconductor device shown in FIG. 1, in comparison with those of other metals.

DESCRIPTION OF THE PREFERRED EMBODIMENTS

Figure 1:
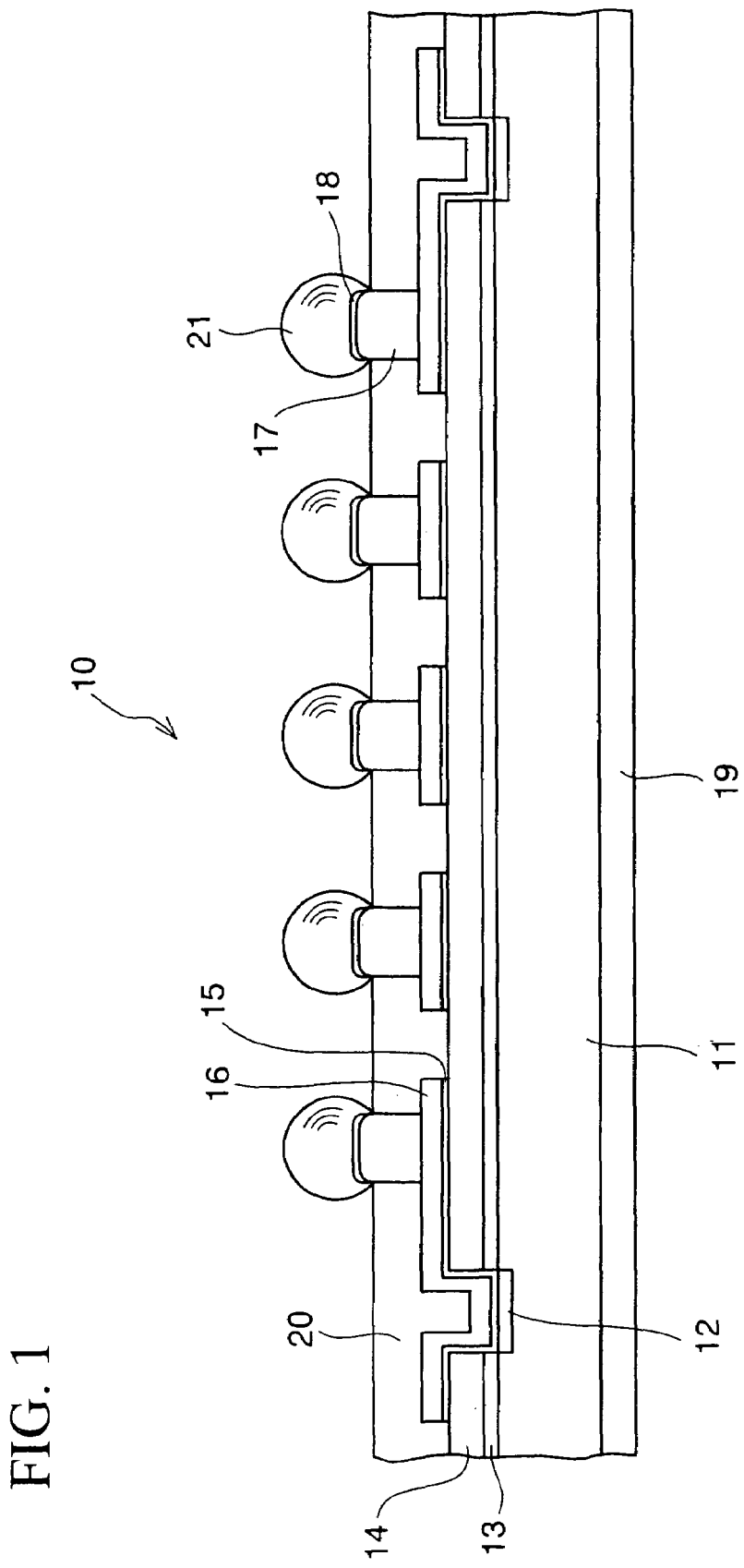
FIG. 1 is a cross-sectional view schematically showing the constitution of a semiconductor device having a CSP structure according to one embodiment of the present invention.

FIG. 1 schematically shows a cross-sectional structure of a semiconductor device having a CSP structure according to one embodiment of the present invention.

In FIG. 1, 10 denotes a semiconductor device (CSP) according to the present embodiment, and 11 denotes a silicon (Si) substrate having the devices formed therein. The silicon substrate 11 is a portion obtained by cutting (dividing) a semiconductor (silicon) wafer which will be described later. Also, 12 denotes electrode pads each of which is delimited by a partial area of a wiring pattern formed on the device; 13 denotes a passivation film as a protective film formed on the surface (upper surface in the example shown in the drawing) of the silicon substrate 11; 14 denotes an insulating film (polyimide resin layer) formed on the passivation film 13; 15 denotes a thin metal film (power supplying layer/plating base film) formed into a required shape on the insulating film 14 by patterning such that openings to which the electrode pads 12 are exposed are covered; 16 denotes a rerouting layer formed on the thin metal film 15; 17 denotes a metal post formed in the terminal formation portion of the rerouting layer 16; 18 denotes a barrier metal layer formed on the tops of the metal posts 17; 19 denotes a metal layer formed on the backside (lower surface in the example shown in the drawing) of the silicon substrate 11; 20 denotes a sealing resin layer formed such that the entire surface of the silicon substrate 11 on the side where the metal posts 17 are formed (however, the tops of the metal posts 17 (barrier metal layer 18) are exposed); and 21 denotes a metal bump (solder bump in the present embodiment) as an external connection terminals bonded to the exposed top of the metal post 17 (barrier metal layer 18).

The metal layer 19 formed on the backside of the silicon substrate 11 has, in addition to a reinforcement function for preventing wafer cracking as described later, a function of performing correction (warp correction function) so that a warp of the wafer does not occur when heat treatment, such as a cure or the like of the sealing resin, is performed. The material and thickness of each member, including this metal layer 19, are not described here, but will be explained in the fabrication method described later, as appropriate.

Hereinafter, the semiconductor device 10 having a CSP structure according to the present embodiment will be described with reference to FIG. 2A to FIG. 5D which show the steps of the fabrication process thereof. It is noted that the cross-sectional structure shown in each drawing (except for FIG. 5D) shows, under magnification, a portion (left-side portion) of the cross-sectional structure shown in FIG. 1.

First, in the first step (FIG. 2A), a wafer 30 having a plurality of devices formed therein is prepared by a well known method. Namely, after a required device process is performed on a wafer having a predetermined thickness (e.g., a thickness of approximately 725 μm in the case of a wafer having a diameter of 8 inches), a passivation film 13 as a protective film made of silicon nitride (SiN), phospho-silicate glass (PSG), or the like, is formed on one side (upper surface in the example shown in the drawing) of the wafer, and the passivation film 13 is removed in portions corresponding to electrode pads 12, each of which is delimited by a partial area of an aluminum (Al) wiring layer formed into a required pattern on the corresponding device (i.e., the relevant portions of the passivation film 13 are opened). The opening of the passivation film 13 is performed by laser processing by means of, for example, a YAG laser, an excimer laser, or the like. Thus, as shown in the drawing, the wafer 30 the surface of which is covered with the passivation film 13 and to which electrodes pads 12 are exposed is fabricated.

In the next step (FIG. 2B), an insulating film 14 is formed on the passivation film 13 of the wafer 30. For example, after photosensitive polyimide resin is applied to the surface of the wafer 30 by photolithography and the soft bake (pre-bake) of the polyimide resin is performed, then exposure and development (patterning of the polyimide resin layer) are performed using a mask (not shown), and further, hard bake (post-bake) is performed, thus forming the insulating film (polyimide resin layer) 14 having opening portions VH in predetermined positions as shown in the drawing. At this time, the patterning of the polyimide resin layer is performed in accordance with the shapes of the electrode pads 12. Accordingly, the polyimide resin layer 14 in portions corresponding to the electrode pads 12 is removed as shown in the drawing, whereby via holes (opening portions VH) extending to the electrode pads 12 are formed.

In the next step (FIG. 2C), a thin metal film 15 is formed by sputtering on the entire surface on the side where the insulating film (polyimide resin layer) 14 is formed. The thin metal film 15 has a two-layer structure including either a chromium (Cr) layer or a titanium (Ti) layer which constitutes a contact metal layer and a copper (Cu) layer stacked on the contact metal layer. The thin metal film 15 can be formed by depositing Cr or Ti on the entire surface by sputtering (contact metal layer: Cr layer or Ti layer) and further depositing Cu thereon by sputtering (Cu layer). The thin metal film 15 formed as described above functions as a plating base film (power supplying layer) in electrolytic plating necessary for a rerouting step and a metal post formation step to be performed later.

In the next step (FIG. 2D), after dehydro-baking is carried out to the surface (surface of the Cu layer) of the thin metal film 15 and liquid photoresist is applied thereto and dried, exposure and development (patterning of the photoresist) are performed using a mask (not shown), thus forming a resist layer R1. The patterning of this photoresist is performed in accordance with the shape of a rerouting pattern to be formed in the next step.

In the next step (FIG. 3A), the surface of the thin metal film 15 is electrolytically plated with Cu using the thin metal film 15 as a power supplying layer, and a rerouting layer (rerouting pattern) 16 of Cu is formed using the patterned resist layer R1 as a mask.

In the next step (FIG. 3B), the photoresist (resist layer R1) is stripped off and removed, for example, using stripper containing organic solvent.

In the next step (FIG. 3C), after the surface (Cu layer surface) of the thin metal film 15 and the surface of the rerouting layer 16 are cleaned, a photosensitive dry film (having a thickness of approximately 100 μm) is adhered thereto, and further, exposure and development (patterning of the dry film) are performed using a mask (not shown), thus forming a resist layer R2. The patterning of this dry film is performed in accordance with the shapes of metal posts to be formed in the next step.

In the next step (FIG. 4A), the surface of the rerouting layer 16 is electrolytically plated with Cu using the thin metal film 15 as a power supplying layer as before, thus forming posts (metal posts) 17 of Cu in terminal formation portions of the rerouting layer 16 using the patterned resist layer R2 as a mask. The height of the Cu post 17 is approximately 100 μm, similarly to the thickness of the dry film (resist layer R2).

Further, a barrier metal layer 18 is formed on the tops of the Cu posts 17 by electrolytic plating. The barrier metal layer 18 (Ni/Pd/Au) can be formed by, for example, plating the surfaces of the Cu posts 17 with nickel (Ni) for improving adhesiveness using the Cu posts 17 as a power supplying layer, further plating the surface of this Ni layer with palladium (Pd) for improving conductivity, and then plating the surface of this Pd layer with gold (Au). In this case, the Au layer may be formed directly on the Ni layer (Ni/Au) without providing the Pd layer. At this time, the surface (upper surface in the example shown in the drawing) on the side where the rerouting pattern is formed has been almost planarized by the surfaces of the Cu posts 17 (barrier metal layer 18) and the surface of the dry film (resist layer R2).

In the next step (FIG. 4B), the backside (lower surface in the example shown in the drawing) of the wafer is ground using a well known grinding machine, thus thinning the wafer 30 to a predetermined thickness (e.g., approximately 250 μm to 300 μm). At this time, since the pattern surface (upper surface) of the structure fabricated in the preceding step has been almost planarized, it is easy to chuck the pattern surface when the relevant structure is held before grinding. Accordingly, it is possible to grind the backside of the wafer 30 in such a chucked state until a predetermined thickness is reached as represented by the arrows in the drawing.

In the next step (FIG. 4C), the dry film (resist layer R2) is stripped off and removed using alkaline chemical solution, for example, sodium hydroxide (NaOH)-based solution, monoethanolamine-based solution, or the like.

In the next step (FIG. 4D), the exposed plating base film (thin metal film 15) is removed by wet etching. Namely, the Cu layer in the upper portion of the thin metal film 15 is removed using etchant for dissolving Cu, and then, the contact metal layer (Cr layer or Ti layer) in the lower portion is removed using etchant for dissolving Cr or Ti. Thus, the insulating film (polyimide resin layer) 14 is exposed as shown in the drawing. Thereafter, predetermined surface cleaning and the like are performed.

Incidentally, when the etchant for dissolving Cu is used, it seems that Cu constituting the rerouting layer 16 is also removed and that the rerouting pattern is broken. However, there is no such a disadvantage actually. The reason is as follows: the film thickness of the upper portion of the thin metal film 15 is in the order of micron or less (approximately 0.5 μm) because the upper portion is formed by sputtering using Cu as previously described, while the film thickness of the rerouting layer 16 is at least approximately 10 μm because the rerouting layer 16 is formed by electrolytic Cu plating; accordingly, in the rerouting layer 16 (Cu), only the surface portion thereof is removed but the rerouting pattern is not broken, even when Cu of the thin metal film 15 is fully removed.

In the next step (FIG. 5A), in order to cope with wafer cracking and wafer warp, a metal layer 19 with high stress resistance is formed on the backside of the wafer 30. The metal layer 19 can be formed using sputtering or vapor deposition.

Conditions required for the metal layer 19 are as follows: a linear thermal expansion coefficient relatively close to that of the wafer 30; a high elastic modulus; and a high thermal conductivity. For example, referring to the physical property table of various metals shown in FIG. 6, a metal having a linear thermal expansion coefficient relatively close to $\alpha \approx 2.6$ $(K^{-1})$, i.e., close to the linear thermal expansion coefficient of silicon (Si), which is the material of the wafer 30, is favorably used: for example, tungsten (W) having a linear thermal expansion coefficient $\alpha \approx 4.5$ $(K^{-1})$, molybdenum (Mo) having a linear thermal expansion coefficient $\alpha = 3.7$ to $5.3$ $(K^{-1})$, or the like. Since the linear thermal expansion coefficients of tungsten (W) and molybdenum (Mo) are very low compared with those of other representative metals, adhesiveness to the backside of the wafer (Si) is expected to be favorable. Moreover, tungsten (W) and molybdenum (Mo) have elastic moduli (E) which are one order higher than those of other representative metals, and further have relatively high thermal conductivities which are inferior to those of copper (Cu) and gold (Au) but at the same level as that of aluminum (Al).

In the next step (FIG. 5B), sealing is performed using sealing resin (forming of a sealing resin layer 20) such that the entire surface of the wafer 30 on the side where the Cu posts 17 are formed is covered (however, the tops of the Cu posts 17 (barrier metal layer 18) are exposed). This can be performed, for example, as described below.

First, sealing dies including separate upper and lower dies are prepared and heated to a predetermined temperature (approximately 175° C.). Next, a resin film is adhered to the upper die, the wafer 30 is placed in a concave portion of the lower die, and highly-adhesive thermosetting resin (e.g., epoxy resin) having the form of a tablet is further placed as sealing resin thereon. Then, the thermosetting resin is melted and spread over the entire surface of the wafer by the heat of the sealing dies and the pressure of a press (for approximately three minutes), and a process for curing the thermosetting resin is performed with the wafer 30 held in the dies (for approximately four hours). Thereafter, the wafer 30 is removed from the dies. At this time, since the wafer 30 has been integrated with the resin film, the resin film is stripped off from the wafer 30. Thus, the wafer 30 the surface of which is covered with a sealing resin layer 20 and to which the tops of the Cu posts 17 (barrier metal layer 18) are exposed is fabricated.

In the next step (FIG. 5C), after flux as a surface preparation agent is applied to the exposed tops of the Cu posts 17 (barrier metal layer 18), solder balls to be used as external connection terminals are mounted thereon and fixed thereto by reflow at a temperature of approximately 240° C. to 260° C. (bonding of solder bumps 21). Thereafter, the flux is removed by cleaning the surface.

In the last step (FIG. 5D), the wafer 30 (including the insulating film 14, the metal layer 19, and the sealing resin layer 20) to which the solder bumps 21 have been bonded in the preceding step is cut using a dicer or the like (blade BL of a dicer in the example shown in the drawing) and divided into individual chips (devices). Although not particularly shown in the drawing, the wafer 30 to which the solder bumps 21 are bonded is mounted on dicing tape supported by a dicing frame in the state where the surface of the wafer 30 on the side where the metal layer 19 is formed is adhered to the dicing tape, the wafer 30 is cut along lines delimiting areas for the devices using the blade BL of the dicer, and then each cut and divided chip (device) is picked up. Thus, the semiconductor device 10 (FIG. 1) having a CSP structure according to the present embodiment is fabricated.

As described above, according to the semiconductor device 10 (FIG. 1) having a CSP structure of the present embodiment and the method of fabricating the same (FIG. 2A to FIG. 5D), the wafer 30 can be processed in a thick state (in this case, a thick-wafer state of approximately 725 μm) until the step (FIG. 4A) of forming the Cu posts 17 and the barrier metal layer 18. Moreover, even after the wafer 30 has been thinned by back grinding (after the resist layer R2 has been stripped off and the exposed thin metal film 15 has been removed), the existence of the metal layer 19 formed on the wafer backside immediately thereafter allows the wafer 30 to be brought to steps in the thick-wafer state. Namely, since the metal layer 19 plays a role in reinforcing the wafer 30 and allows the wafer 30 to be brought to almost all steps in the thick-wafer state, the occurrence of "wafer cracking" as observed in conventional technologies can be prevented in realizing the thinning of a wafer-level package.

Figure 5A:
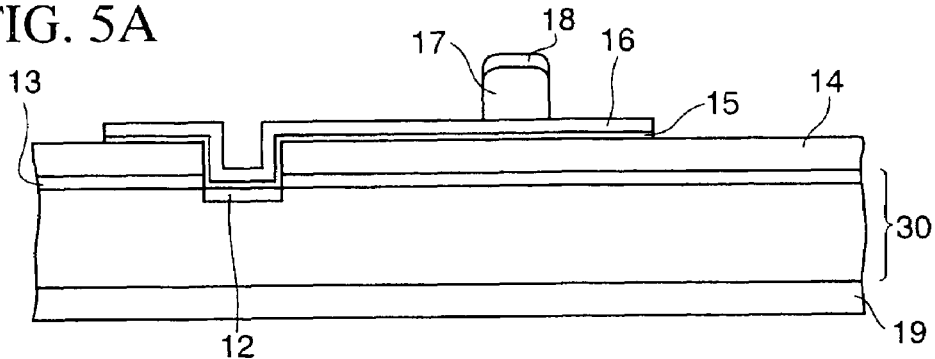
FIGS. 5A to 5D are cross-sectional views (some of which are perspective views) showing steps subsequent to the steps shown in FIGS. 4A to 4D.
Figure 5B:
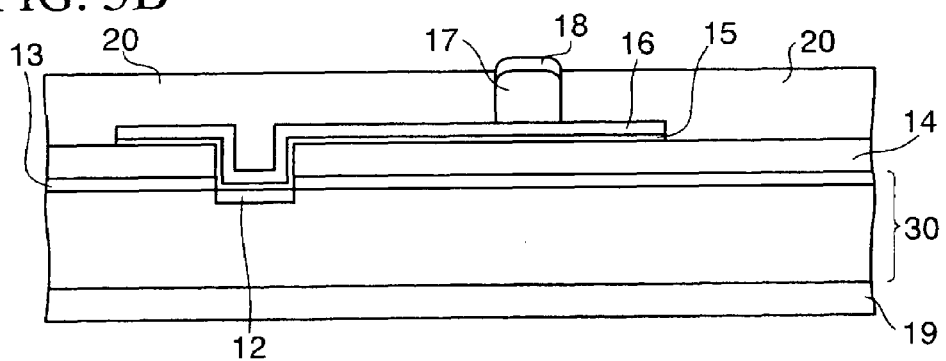
Figure 5C:
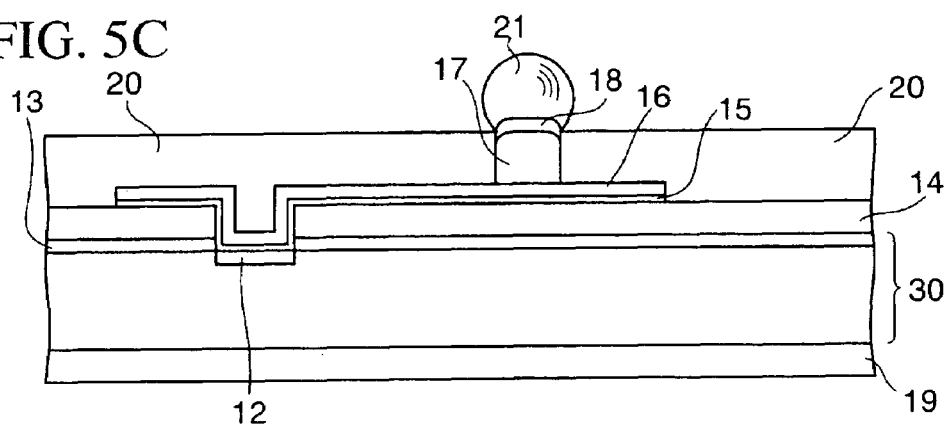
Figure 5D:
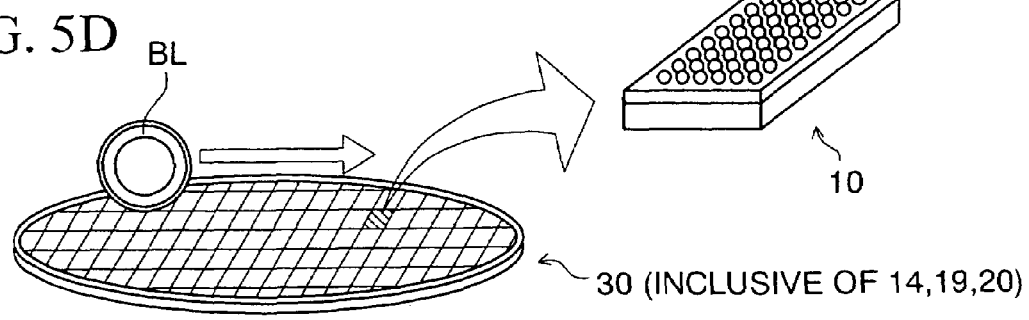

Moreover, the metal layer 19 formed on the backside of the wafer 30 is made of metal (e.g., tungsten (W), molybdenum (Mo), or the like) having a linear thermal expansion coefficient relatively close to that of the wafer 30, and therefore has the function of inhibiting the wafer 30 from being pulled toward the resin layer 20 side under the influence of the thermal shrinkage of the mold resin when sealing with mold resin and the thermosetting (cure) thereof are performed in the subsequent step (FIG. 5B). Namely, the metal layer 19 plays a role in correcting a warp of the wafer 30 and maintaining the flatness of the wafer 30 after the step of resin sealing.

In relation to this, what corresponds to the metal layer 19 (warp correction layer) in conventional technologies is a resin film layer formed by thermally curing resin such as epoxy resin or the like. There is a relatively large difference in linear thermal expansion coefficient between the resin film layer (warp correction layer) and a wafer (silicon). Accordingly, there has been the following problem: chipping and the like easily occur due to a mechanical shock during dicing, and this causes delamination between the resin film layer and the device interface (chip backside).

Contrary to this, in the present embodiment, the metal layer 19 formed on the wafer backside is left as a permanent film as heretofore. However, since the difference in linear thermal expansion coefficient between the metal layer 19 (warp correction layer) and the wafer 30 (silicon) is relatively small (FIG. 6), chipping or the like does not easily occur under a mechanical shock during dicing. As a result, delamination almost never occurs between the metal layer 19 and the device interface (chip backside). Accordingly, there is no disadvantage in that various kinds of reliability tests (test on the reliability of adhesiveness to the wafer, and the like) performed before dicing are wasted due to the occurrence of delamination as heretofore.

Moreover, since the metal layer 19 is formed in one step by sputtering or vapor deposition, the fabrication process can be simplified compared with the case where an insulating resin layer of epoxy resin or the like is formed through a relatively large number of steps (four steps of laminating an epoxy resin material, removing an unnecessary peripheral portion, stripping off a protective base material, and thermosetting) as heretofore.

Furthermore, each device (semiconductor device 10 having a CSP structure shown in FIG. 1) has a structure in which the metal layer 19 is exposed to the backside thereof, and therefore has an advantage in heat spread effect compared with a structure in which the backside of a package is covered with an insulating resin layer of epoxy resin or the like as heretofore. That is, the metal layer 19 can function as a heat spreader.

Figure 3A:
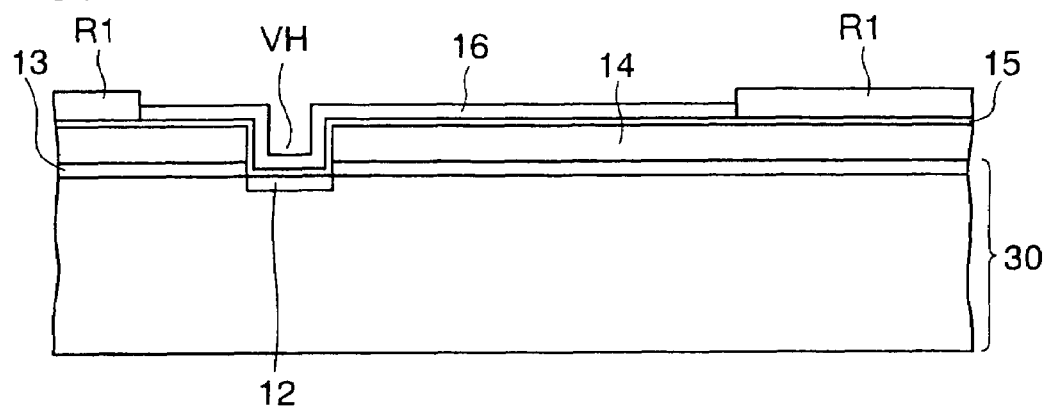
FIGS. 3A to 3C are cross-sectional views showing steps subsequent to the steps shown in FIGS. 2A to 2D.
Figure 3B:
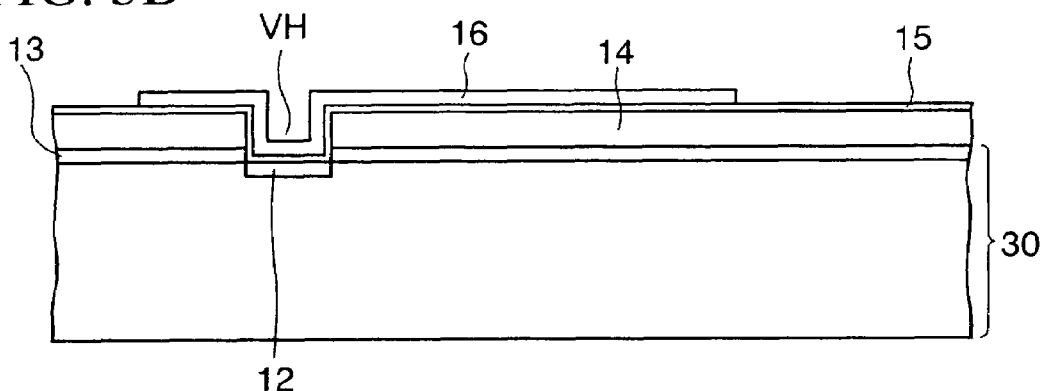
Figure 3C:
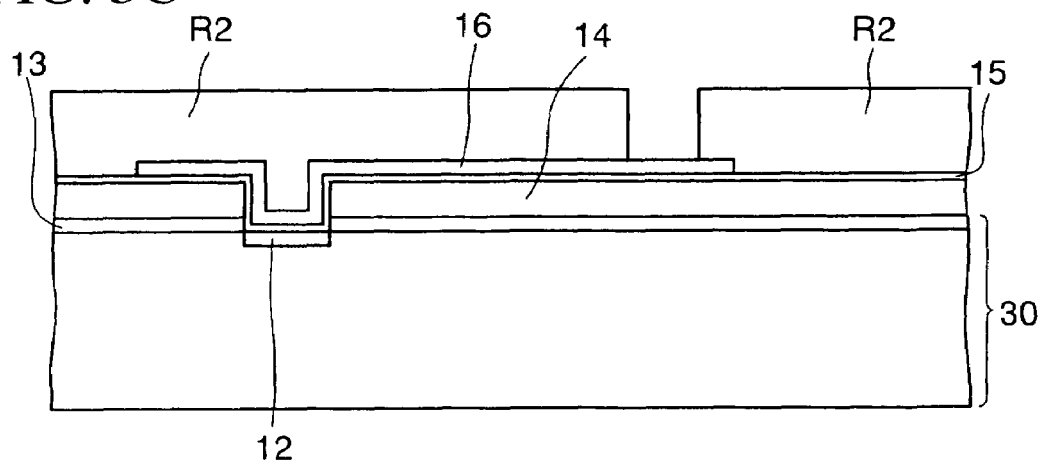
Figure 4A:
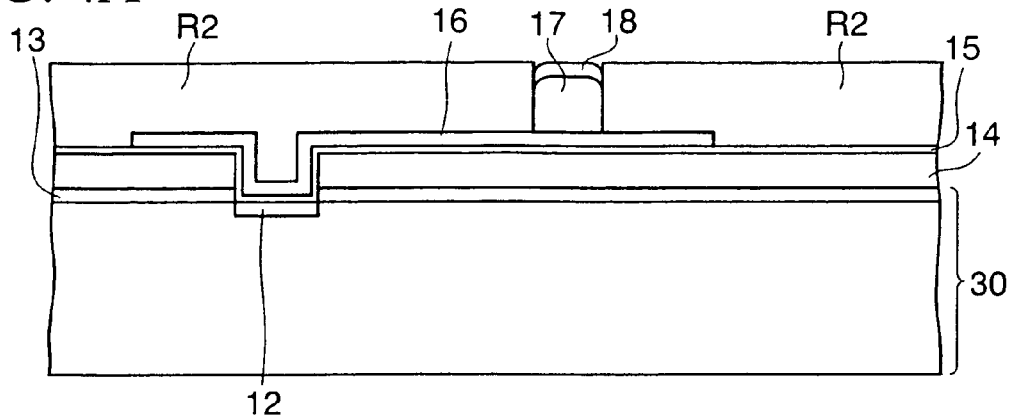
FIGS. 4A to 4D are cross-sectional views showing steps subsequent to the steps shown in FIGS. 3A to 3C.
Figure 4B:
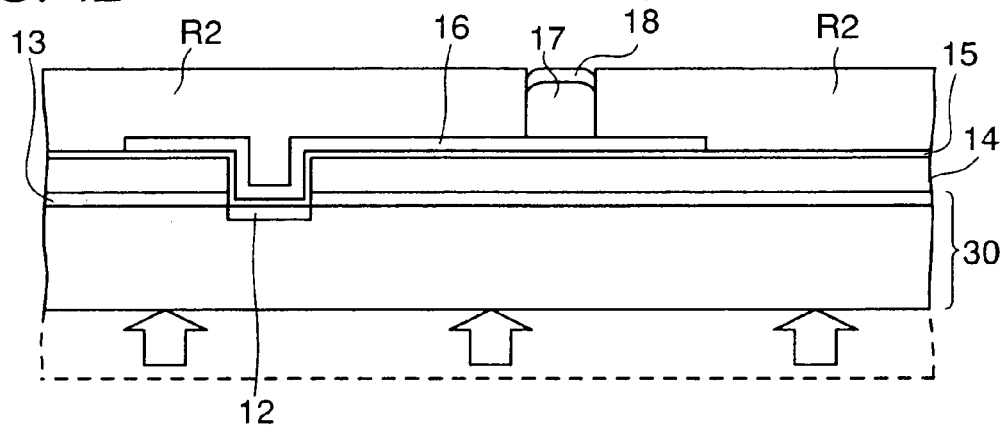
Figure 4C:
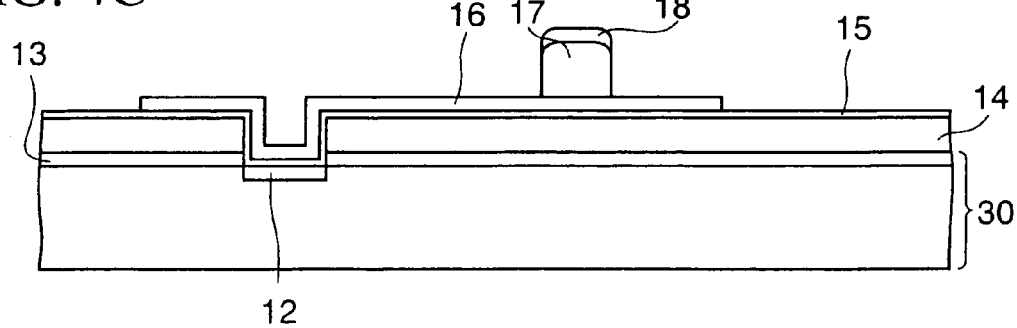
Figure 4D:
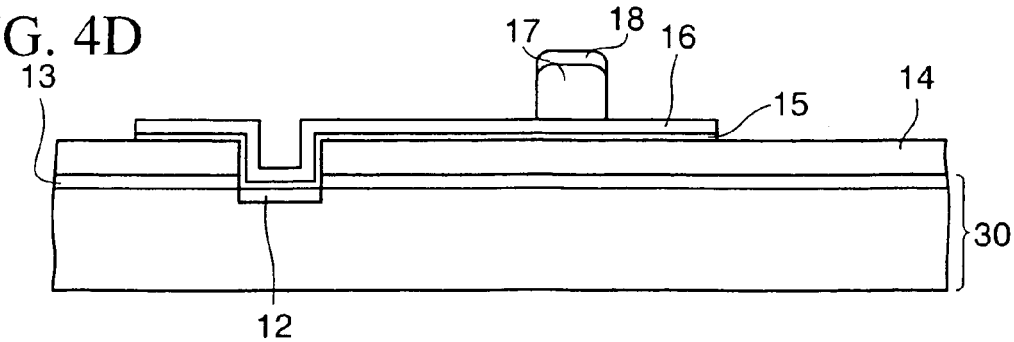

In the aforementioned embodiment, the back grinding of the wafer 30 is performed (FIG. 4B) immediately after the Cu posts 17 and the barrier metal layer 18 are formed. However, of course, the timing of the wafer back grinding is not limited to the above-described time. It is only essential that the timing is in a phase in which the wafer surface has been almost planarized immediately before wafer back grinding is performed and which is as late as possible in a fabrication process of a wafer-level package. For example, wafer back grinding may be performed in the phase immediately after the rerouting layer 16 is formed (FIG. 3A).

Figure 2A:
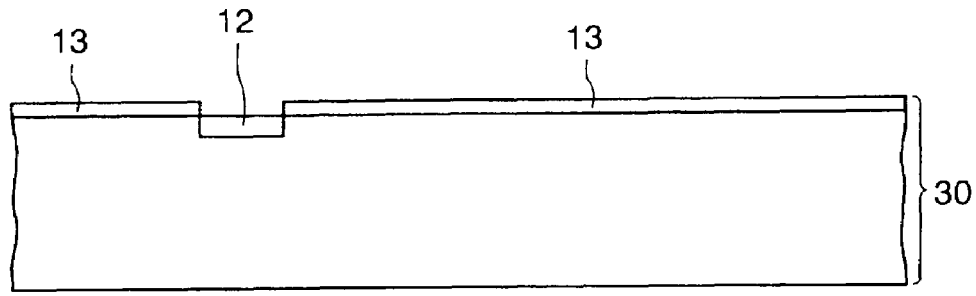
FIGS. 2A to 2D are cross-sectional views showing examples of steps of a fabrication process of the semiconductor device shown in FIG. 1.
Figure 2B:
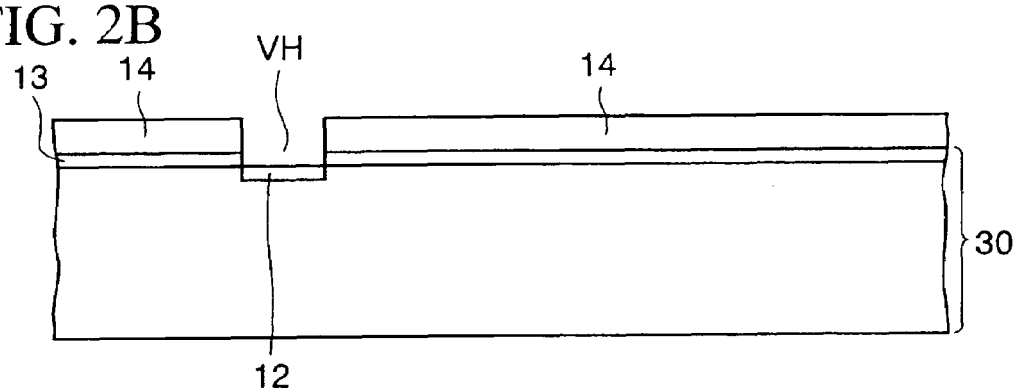
Figure 2C:
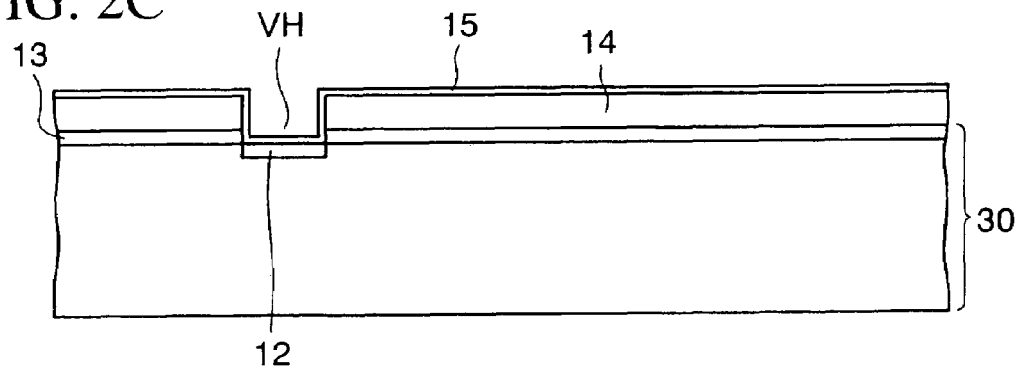
Figure 2D:
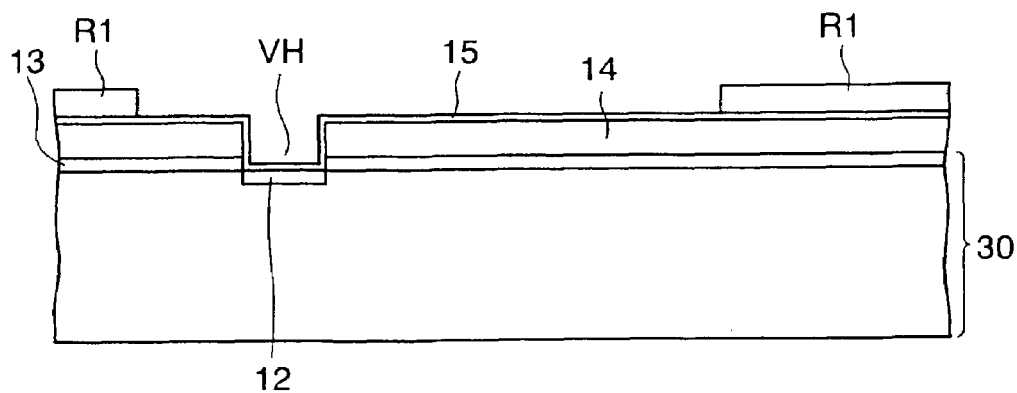

Also, in the aforementioned embodiment, the passivation film 13 as a protective film is provided on one side of the wafer in the step of FIG. 2A. However, in some cases, the function of a passivation film may be shared with the insulating film (polyimide resin layer) 14 which is to be formed in the subsequent step (step of FIG. 2B), without providing the passivation film 13. Alternatively, on the contrary, the passivation film 13 may be provided alone without providing the insulating film 14. Furthermore, although photosensitive polyimide resin is used for the insulating film 14 formed on the surface of the wafer 30 in the step of FIG. 2B, material for the insulating film is, of course, not limited to photosensitive resin. For example, resin, such as non-photosensitive polyimide resin, epoxy resin, or the like, may be used.

What is claimed is:

1. A method of fabricating a semiconductor device, comprising the steps of:
    forming an insulating film on a surface of a semiconductor wafer on a side where a plurality of devices are formed, the insulating film having an opening portion to which an electrode pad of each device is exposed;
    forming a conductor layer on the insulating film, the conductor layer being patterned into a required shape to cover the opening portion to which the electrode pad is exposed;
    forming a resist layer on the conductor layer, the resist layer having an opening portion to which a terminal formation portion of the conductor layer is exposed;
    forming a metal post in the terminal formation portion of the conductor layer with the resist layer being used as a mask;
    thinning the semiconductor wafer to a predetermined thickness by grinding one surface thereof, the one surface being opposite to a side where the metal post is formed;
    forming a metal layer on the ground surface of the semiconductor wafer after removing the resist layer, the metal layer being made of metal having a linear thermal expansion coefficient close to that of the semiconductor wafer;
    sealing the surface of the wafer with sealing resin with a top of the metal post being exposed;
    bonding a metal bump to the top of the metal post; and
    dividing the semiconductor wafer to which the metal bump is bonded, into each device.

2. The method according to claim 1, wherein the metal layer is formed by any one of sputtering and vapor deposition.

3. The method according to claim 1, wherein silicon is used as material for the semiconductor wafer, and any one of tungsten and molybdenum is used as metal constituting the metal layer.

4. The method according to claim 1, further comprising a step of forming a barrier metal layer on the top of the metal post, between the step of forming the metal post and the step of thinning the semiconductor wafer.

* * * * *